US012588168B2

(12) United States Patent
Beauchemin et al.

(10) Patent No.: US 12,588,168 B2
(45) Date of Patent: Mar. 24, 2026

(54) ADAPTIVE THERMAL CONTROL OF DATA CENTER AND IT EQUIPMENT

(71) Applicant: Google LLC, Mountain View, CA (US)

(72) Inventors: Melanie Beauchemin, Mountain View, CA (US); Madhusudan K. Iyengar, Foster City, CA (US); Reza H. Khiabani, San Mateo, CA (US); Jeremy Rice, Austin, TX (US); Jeffrey Ewin, Austin, TX (US)

(73) Assignee: Google LLC, Mountain View, CA (US)

( * ) Notice: Subject to any disclaimer, the term of this patent is extended or adjusted under 35 U.S.C. 154(b) by 792 days.

(21) Appl. No.: 17/829,984

(22) Filed: Jun. 1, 2022

(65) Prior Publication Data

US 2023/0397378 A1      Dec. 7, 2023

(51) Int. Cl.
*H05K 7/20* (2006.01)
(52) U.S. Cl.
CPC ..... *H05K 7/20836* (2013.01); *H05K 7/20263* (2013.01); *H05K 7/20272* (2013.01); *H05K 7/20718* (2013.01)
(58) Field of Classification Search
CPC ........................ H05K 7/20718; H05K 7/20836
See application file for complete search history.

(56) References Cited

U.S. PATENT DOCUMENTS 6,483,334 B1 * 11/2002 Hsieh ................. G01R 31/2855
                                                714/E11.154
9,207,993 B2    12/2015 Jain 9,351,431 B2    5/2016  Campbell et al.
9,654,414 B2    5/2017  Chatterjee et al.
9,727,432 B1 *  8/2017  Cutforth ............. G06F 11/0727
(Continued)

FOREIGN PATENT DOCUMENTS

CN        102762926 A    10/2012
CN        103448563 A    12/2013
(Continued)

OTHER PUBLICATIONS

Arno et al. More Bang for the Data Center Buck: Savvy Technology Use Can Yield Tier 2 Facilities Nearly Equal to Tier 4. IEEE Industry Applications Magazine, IEEE Service Center, Piscataway, NJ, US, vol. 22, No. 4, Jul. 1, 2016 (Jul. 1, 2016), pp. 47-54.
(Continued)

*Primary Examiner* — Mark A Connolly
(74) *Attorney, Agent, or Firm* — Lerner David LLP

(57) ABSTRACT

A data center thermal control system includes a local cooler configured to cool a local coolant used for cooling electronic hardware, an outer heat exchanger configured to exchange heat from fluid to outside air, and a fluid circulation system configured to convey heat from the local cooler to the outer heat exchanger by circulating at least one fluid cooling medium, the fluid circulation system including a cold portion directed to the air cooler. The thermal control system also includes one or more processors and a non-transitory computer-readable medium storing instructions that, when executed by the one or more processors, would cause the one or more processors to govern the outer heat exchanger to cool fluid in the cold portion to a first target temperature during a hot season, and cool fluid in the cold portion to a lower target temperature during a cold season.

10 Claims, 9 Drawing Sheets

(56)            References Cited

U.S. PATENT DOCUMENTS

| | | | |
|---|---|---|---|
| 2004/0019838 A1* | 1/2004 | Marr .............. | G01R 31/318511 |
| | | | 714/718 |
| 2008/0147976 A1* | 6/2008 | Bienek ................ | G06F 12/0846 |
| | | | 711/E12.024 |
| 2012/0138259 A1 | 6/2012 | Carlson | |
| 2013/0098599 A1 | 4/2013 | Busch et al. | |
| 2013/0337273 A1* | 12/2013 | Boday ................. | H01L 23/4006 |
| | | | 427/302 |
| 2014/0343748 A1 | 11/2014 | Suzuki | |
| 2017/0138628 A1 | 5/2017 | Sondur et al. | |
| 2020/0060033 A1* | 2/2020 | Adrian ................. | H05K 7/1454 |
| 2023/0397378 A1* | 12/2023 | Beauchemin ...... | H05K 7/20272 |

FOREIGN PATENT DOCUMENTS

| | | | |
|---|---|---|---|
| CN | 103547122 A | 1/2014 | |
| CN | 106415158 A | 2/2017 | |
| CN | 112005622 A | 11/2020 | |
| CN | 114491411 A | 5/2022 | |

OTHER PUBLICATIONS

Extended European Search Report for European Patent Application No. 22206915.5 dated Jul. 6, 2023. 17 pages.
Partial European Search Report for European Patent Applicaton No. 22206915.5 dated May 17, 2023. 14 pages.
Office Action for Taiwanese Patent Application No. 112105089 dated Jun. 5, 2025. 12 pages.
Office Action for Chinese Patent Application No. 202310095872.X dated Jul. 26, 2025. 10 pages.

* cited by examiner

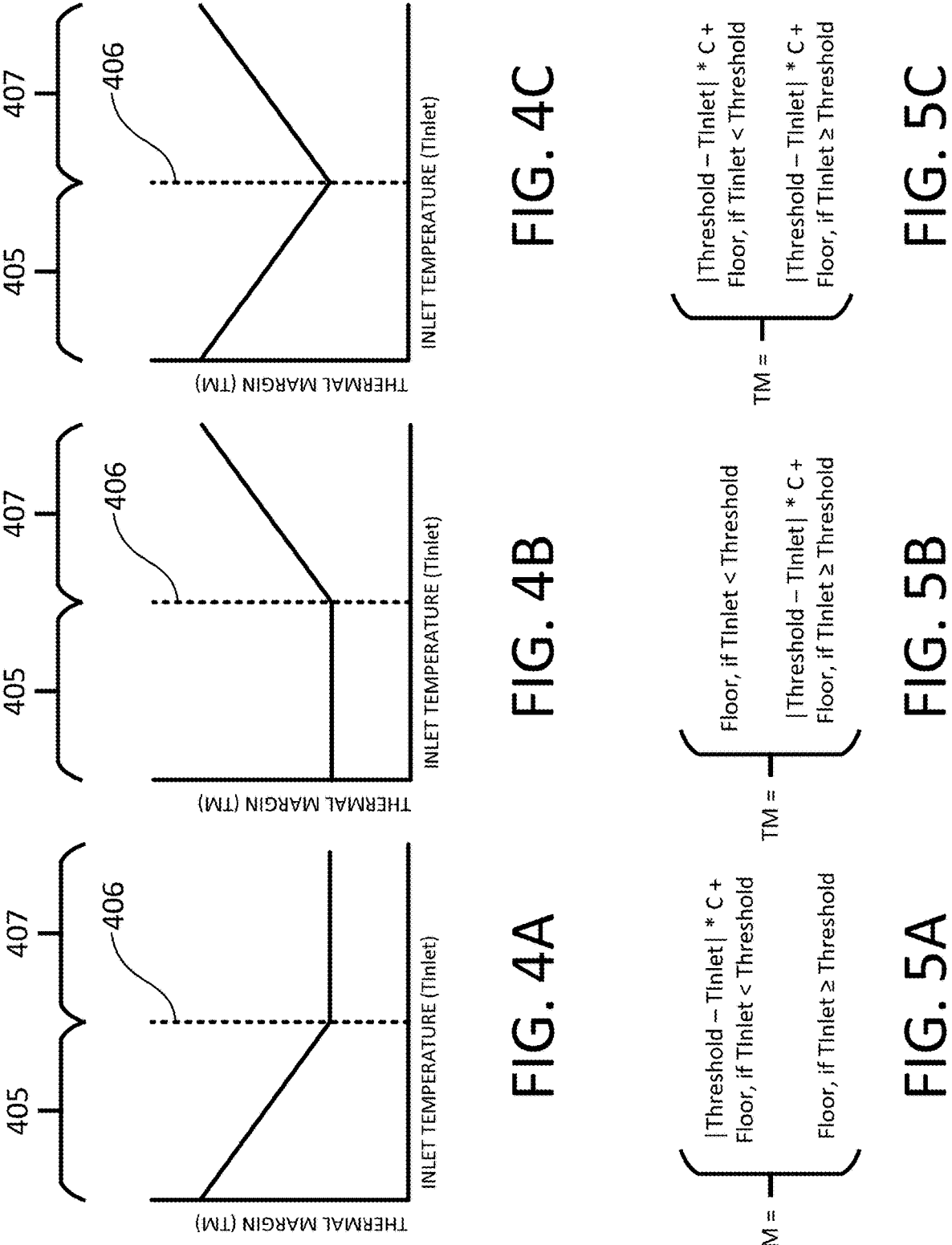

FIG. 4C $$TM = \begin{cases} |Threshold - Tinlet| * C + Floor, & \text{if Tinlet} < Threshold \\ Floor, & \text{if Tinlet} \geq Threshold \end{cases}$$

FIG. 5A $$TM = \begin{cases} Floor, & \text{if Tinlet} < Threshold \\ |Threshold - Tinlet| * C + Floor, & \text{if Tinlet} \geq Threshold \end{cases}$$

FIG. 5B $$TM = \begin{cases} |Threshold - Tinlet| * C + Floor, & \text{if Tinlet} < Threshold \\ |Threshold - Tinlet| * C + Floor, & \text{if Tinlet} \geq Threshold \end{cases}$$

FIG. 5C

ADAPTIVE THERMAL CONTROL OF DATA CENTER AND IT EQUIPMENT

BACKGROUND

Electronic hardware, such as information technology ("IT") equipment, computer hardware, and servers, generates heat when operated. Such hardware operates more efficiently at lower temperatures and tends to fail sooner when operated at higher temperatures. For those reasons, a wide variety of cooling solutions for electronic hardware has been developed.

Data centers are used to house large quantities of electronic hardware, frequently for remote applications such as cloud computing or internet hosting. To manage the significant amount of heat generated by the housed hardware, data centers typically have sophisticated thermal management systems. Those systems can include chains of multiple heat exchanges between various cooling media to carry heat from the hardware out of the data center. Each link in the chain operates according to a set of parameters, such as cooling medium temperatures and flow rates. Those parameters are usually chosen to balance multiple considerations. For example, cooling medium temperatures and flow rates may be chosen to balance the general preferability of lower operating temperatures for the cooled electronic hardware against the costs associated with carrying heat from those components out of the building. The balanced considerations can vary over time, so parameters are set to accommodate the most difficult conditions expected.

BRIEF SUMMARY

Gains in efficiency and hardware lifetime can be made by adapting the operating parameters of a data center's thermal control system as conditions change. In some specific examples, the parameters can be adapted when favorable conditions are expected to occur to take advantage of those favorable conditions.

In some aspects of the present disclosure, operating parameters of a data center thermal control system may be varied seasonally. Where certain operating parameters have been found to strike an acceptable balance between the desirability of greater cooling of hardware or media and the difficulty of expelling heat from a building during the hottest times of the year, those parameters can be varied during times of the year when weather is expected to be cooler. In some examples, an outdoor heat exchanger such as a cooling tower may be used to transfer heat from a cooling medium used by a data center to outside air. Since colder weather will tend to result in lower temperatures of the cooling medium immediately downstream of the tower at no extra expense, any heat exchanges in the data center that transfer heat to the cooling medium will tend to be more efficient when the weather is colder. Thermal control operations throughout the data center, such as any refrigerant cycles, and in some examples a refrigerant cycle for cooling process water, may therefore be adjusted to take advantage of the temporary increase in cooling efficiency by cooling to lower temperatures.

In further aspects of the present disclosure, operating parameters may be adapted to conditions within the data center. Areas where hardware is stored and cooled may be divided into zones, and the cooling medium circulated through zones containing less than their full capacity of hardware can be circulated at a greater rate, a lower temperature, or both at little cost because of the lower cooling burden presented by the under-filled zones. Cooling systems, such as fan systems, for individual hardware components or containers for components can adapt to lower coolant inlet temperatures by reducing a thermal margin for the component or contained components. Following an installation of several new components, the thermal margin for those new components can be either temporarily increased to slow the failure of components during an expected early failure stage, thereby reducing the probability of equipment shortages, or temporarily decreased to shorten the expected early failure stage, thereby causing a stable operation stage during which few failures are expected to arrive sooner.

In some aspects according to any of the foregoing, a data center thermal control system may comprise a local cooler configured to cool a local coolant used for cooling electronic hardware, an outer heat exchanger configured to exchange heat from fluid to outside air, and a fluid circulation system configured to convey heat from the local cooler to the outer heat exchanger by circulating at least one fluid cooling medium, the fluid circulation system including a cold portion directed to the air cooler. The thermal control system may also comprise one or more processors and a non-transitory computer-readable medium storing instructions. The instructions may, when executed by the one or more processors, cause the one or more processors to govern the outer heat exchanger to cool fluid in the cold portion to a first target temperature during a hot season, and cool fluid in the cold portion to a second target temperature during a cold season, the second target temperature being lower than the first target temperature.

In some examples according to any of the foregoing, the cold season may include all months having an annual average temperature below a threshold temperature in a geographic region in which the control system is located.

In some examples according to any of the foregoing, the fluid circulation system may include an inner heat exchanger, an outer loop that circulates fluid between the inner heat exchanger and the outer heat exchanger, and an inner loop that includes the cold portion and circulates fluid between the local cooler and the inner heat exchanger.

In some examples according to any of the foregoing, the local coolant may be circulated air.

In some examples according to any of the foregoing, the second target temperature may vary during the cold season.

In some examples according to any of the foregoing, the cold season may include a plurality of intervals each having an annual average temperature, and at each transition from an earlier of the intervals to a later of the intervals, a difference between the first target temperature and the second target temperature increases if the later of the intervals has a lower annual average temperature than the earlier of the intervals and decreases if the later of the intervals has a higher average temperature than the earlier of the intervals.

In some examples according to any of the foregoing, throughout the cold season, the second target temperature may be a non-piecewise function of a difference between a threshold temperature and an annual average temperature of a current one of the intervals.

In some examples according to any of the foregoing, a data center may have the control system of any of the foregoing examples installed therein. The data center may also comprise a plurality of cooling zones in which the local coolant is circulated, each of the cooling zones having an electronic hardware storage capacity. The instructions, when executed by one or more processors, may cause the processors to govern the control system to increase a flow rate of the local coolant in any cooling zone known to contain less than a predetermined proportion of that cooling zone's hardware storage capacity.

In some examples according to any of the foregoing, the predetermined proportion may be equal for each cooling zone.

In some examples according to any of the foregoing, for each cooling zone containing less than the predetermined proportion of that cooling zone's hardware storage capacity, the instructions, when executed by one or more processors, may cause the airflow rate to increase by an amount that decreases as a difference between that cooling zone's hardware storage capacity and an amount of hardware known to be stored in the cooling zone decreases.

In some examples according to any of the foregoing, the control system may comprise a plurality of cooling zones in which the local coolant is circulated, each of the cooling zones having an electronic hardware storage capacity. The instructions, when executed by one or more processors, may cause the processors to govern the control system to decrease a temperature of the local coolant circulated in any cooling zone known to contain less than a predetermined proportion of that cooling zone's hardware storage capacity.

In another aspect, a container for electronic hardware may comprise a cooling system that includes one or more processors and a non-transitory computer-readable medium storing instructions. The instructions, when executed by the one or more processors, may cause the processors to govern the cooling system to maintain a thermal margin of an electronic hardware component operating in the container above a minimum, wherein the minimum is a piecewise function of a supply temperature of a cooling medium, wherein the thermal margin is a difference between a predetermined temperature and an actual temperature of the component.

In some examples according to any of the foregoing, the piecewise function may include a first sub-function that applies to a first domain and a second sub-function that applies to a second domain on an opposite side of a threshold temperature from the first domain, the first sub-function being a constant, and the second sub-function being a function of the supply temperature.

In some examples according to any of the foregoing, the first domain may be above the threshold temperature.

In some examples according to any of the foregoing, the second sub-function may create a positive relationship between the minimum and an absolute value of a difference between the threshold temperature and the supply temperature.

In some examples according to any of the foregoing, the piecewise function may include a first sub-function that applies to a first domain and a second sub-function that applies to a second domain on an opposite side of a threshold temperature from the first domain, the first sub-function and second sub-function each being a different function of the supply temperature.

In some examples according to any of the foregoing, the first sub-function and the second sub-function may each create a positive relationship between the minimum and an absolute value of a difference between the threshold temperature and the supply temperature.

In some examples according to any of the foregoing, the container may comprise a fan. The cooling medium may be air and the control system may be configured to maintain the margin by varying an operating speed of the fan as necessary keep the margin above the minimum.

In another aspect, a data center thermal control system for cooling a fleet of electronic components may comprise one or more processors and a non-transitory computer-readable medium storing instructions that, when executed by the one or more processors, would cause the processors to govern the control system to cool the fleet to a different thermal margin floor during at least a portion an early failure stage than during a stable stage. The early failure stage may be a window after installation of the components during which an expected failure rate for the components, according to historical failure data, decreases at least at a first rate. The stable stage may be a window after the early failure stage during which the failure rate for the components, according to historical failure data, decreases at less than the first rate and increases at less than a second rate. The thermal margin may be a difference between a predetermined temperature and an actual operating temperature of the component.

In some examples according to any of the foregoing, the instructions, when executed by the one or more processors, may cause the processors to govern the control system to cool the fleet to a stable thermal margin floor during the stable stage and an early margin floor during the early failure stage, wherein the early margin floor is less than the stable margin floor.

In some examples according to any of the foregoing, the instructions, when executed by the one or more processors, may cause the processors to govern the control system to cool the fleet to the early margin floor from installation of the fleet until an adapted stable transition time and to begin cooling the fleet to at least the stable margin floor at the adapted stable transition time, wherein the adapted stable transition time is an earliest time following installation of the fleet when an actual failure rate of components among the fleet is expected to decrease by less than a predetermined rate.

In some examples according to any of the foregoing, the historical failure data may be derived from observed failures of electronic equipment of a same type as the components before the installation.

BRIEF DESCRIPTION OF THE DRAWINGS

FIGS. 4A-4C are graphs of adaptations of thermal margin for electronic hardware dependent on coolant temperature according to various aspects of the present disclosure.

FIGS. 5A-5C are functions represented by the graphs of FIGS. 4A-4C.

DETAILED DESCRIPTION

Figure 1:
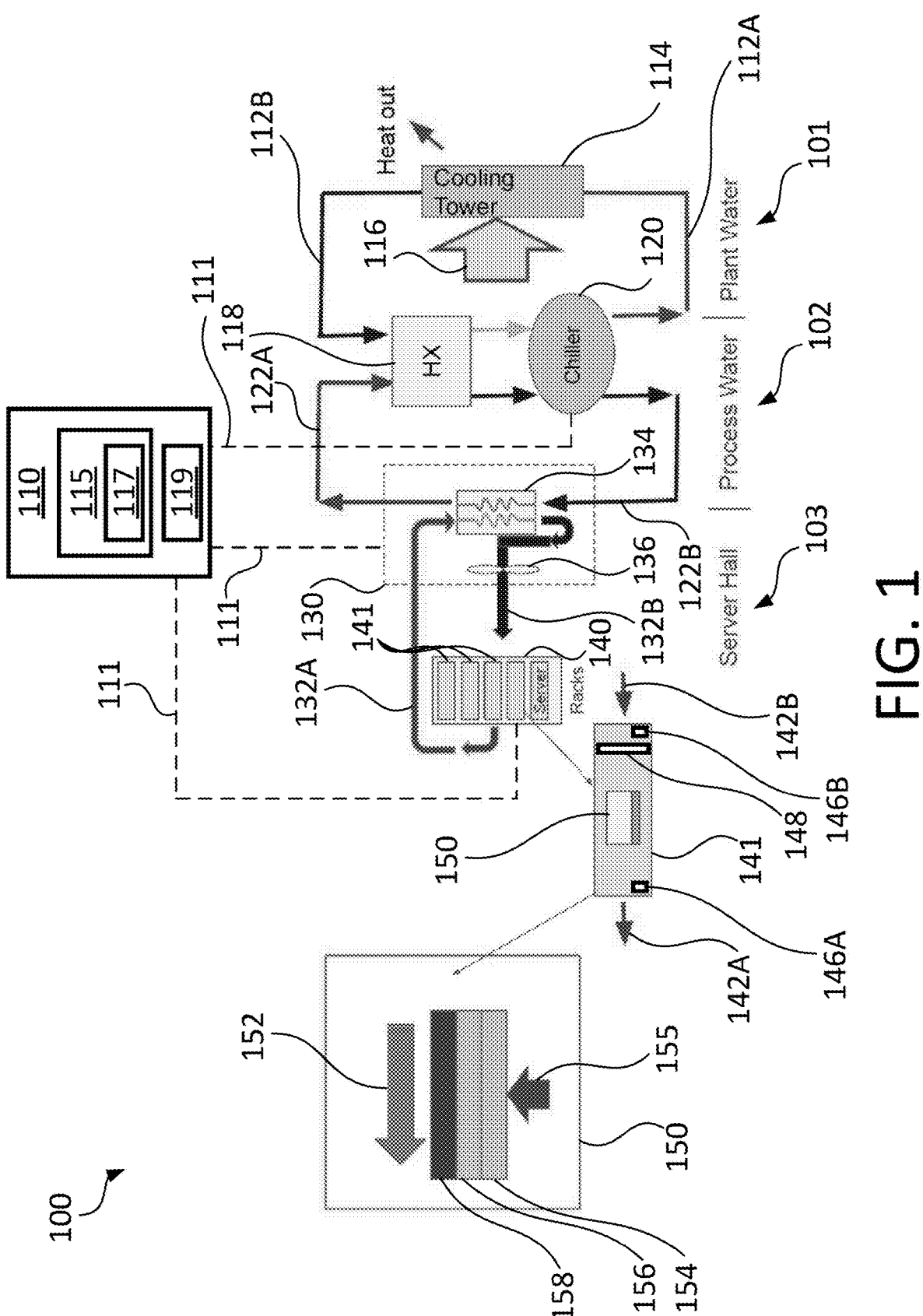
FIG. 1 is a schematic representation of a thermal control system for a data center.

FIG. 1 shows a thermal control system 100 for a data center. Thermal control system 100 is governed by a controller 110 in electronic communication 111 with other elements of thermal control system 100. Controller 110 includes memory 115 in the form of a non-transitory, computer readable medium that stores data that may be read with the aid of an electronic device. The medium may be, for example, a hard-drive, memory card, read-only memory ("ROM"), random access memory ("RAM"), optical disks, or any other type of write-capable and read-only memory. Memory 115 stores instructions 117 that, when read by a processor 119 or processors of controller 110 would cause the processor 119 or processors to enact adaptive thermal control operations as described herein, individually or in any combination, by controlling other hardware in thermal control system 100. The instructions 117 may be instructions to enact any of the thermal control operations described herein individually or in any combination. Though controller 110 is illustrated as a single unit, controller 110 may instead be multiple devices distributed across thermal control system 100 having different roles and governing different hardware, and in various examples those distributed devices may or may not be in electronic communication with one another. Thus, in other examples, any element of thermal control system 100 shown to be in electronic communication 111 with controller 110 in the illustrated example may instead be in electronic communication with a discrete controller that does not govern other elements of the system.

Thermal control system 100 includes multiple cooling loops. The illustrated example will be described with water as a medium circulated in some of those loops, such as the "Plant Water" loop and the "Process Water" loop. Thus, water is presented as an example of a cooling medium with which the concepts of the present disclosure may be implemented, but the same concepts could be applied in the same way with any other fluid cooling medium. For each reference to water in the present description, the water should therefore be considered to be interchangeable with other fluid cooling media as well.

A plant water loop 101 is used to transfer heat collected from across the data center out of the building. Plant water loop 101 includes a hot side 112A that carries water heated by other portions of thermal control system 100 toward a cooling tower 114 and a cold side 112B that carries water from cooling tower 114 back to other parts of thermal control system 100. Cooling tower 114 is an outer heat exchanger that transfers heat from the hot plant water to the environment outside of the data center. In the specific example of cooling tower 114, heat exits the plant water by the passage of ambient air 116 across cooling tower 114. Cooling tower 114 is constructed to conduct heat from plant water within cooling tower 114 to external surfaces of cooling tower 114, so the flow of ambient air 116 across those external surfaces will cool the plant water. In various examples, cooling tower 114 may operate entirely passively or fans or other impellers may be used to force ambient air 116 across cooling tower 114. Cooling tower 114 is one example of an outer heat exchanger, and in other examples, other outer heat exchangers may be used instead of or in addition to cooling tower 114 to transfer heat from the plant water loop 101 to the environment outside of the data center.

Process water loop 102 similarly includes a hot side 122A that carries water heated by other elements in the data center and a cold side 122B carrying water that can be used as a coolant. Between process water loop's 102 hot side 122A and cold side 122B, heat is transferred from the process water to the plant water. Thus, heat collected by process water loop 102 can be transferred to plant water loop 101 to be carried out of the building. Plant water loop 101 is therefore an outer loop in the sense that it is nearer along the path of heat through the data center to the point where heat exits the building while process water loop 102 is an inner loop in the sense that it is further along the path of heat through the data center from the point where heat exits the building. Only one process water loop 102 and plant water loop 101 are shown in the illustrated example, but thermal control systems 100 of other examples could include multiple process water loops 102 transferring heat to a single plant water loop 101 or multiple plant water loops 101 collecting heat from a single process water loop 102.

Heat is transferred from process water loop 102 to plant water loop 101 by an inner heat exchanger 118 and a chiller 120, both of which are downstream of hot side 122A and upstream of cold side 122B of process water loop 102 and downstream of cold side 112A and upstream of hot side 112B of plant water loop 101. Heat exchanger 118 may be any type of heat exchanger, such as, for example, a shell and tube heat exchanger, a plate heat exchanger, or any other type of structure that causes the process water and plant water to flow across opposite sides of a thermally conductive barrier. Chiller 120 is downstream of heat exchanger 118 and may be any device that uses a refrigerant loop to carry heat from the process water to the plant water. Heat exchanger 118 is optional, so some implementations other than the illustrated example omit heat exchanger.

Process water loop 102 collects heat from one or more zone coolers 130. Though only one zone cooler 130 is illustrated, multiple zone coolers 130 may be connected to process water loop 102 between hot side 122A and cold side 122B of process water loop 102.

Each zone cooler 130 includes a cooling element 134, which may be, for example, a heat exchanger, a refrigerant cycle based chiller, or both, for transferring heat from a local medium loop 103 to process water loop 102. Zone cooler 130 of the illustrated example also includes a driver 136 that forces a local cooling medium along local medium loop 103. The illustrated zone cooler 130 therefore may be, for example, a cooling fan, in which case cooling element 134 may be cooling fan coils and driver 136 may be an impeller for driving air as the local cooling medium, or a cooling distribution unit ("CDU"), in which cooling element 134 may be any device suitable for cooling a fluid as the local cooling medium and driver 136 may be a pump. In other arrangements, driver 136 may be omitted if local medium loop 103 is of a type that does not need to be forced, such as, for example, in implementations wherein local medium loop 103 is an evaporative cooling loop and cooling element 134 is a condenser. In data centers that house multiple zone coolers 130 and local medium loops 103, the zone coolers 130 and local medium loops 103 can be of different types.

Local medium loop 103 includes a cold side 132B that carries a local cooling medium, such as air, water, dielectric fluid, or any other coolant suitable for the type of electronic hardware being cooled, to one or more housings 140 at a relatively low temperature, and a hot side 132A that returns the local cooling medium back to zone cooler 130 after the local cooling medium has been used to cool the electronic hardware. Though only one housing 140 is illustrated, each zone may contain several housings.

Each housing 140 contains one or more units 141. Each unit 141 can be an individual electronic hardware component or a container or housing for electronic hardware. In the illustrated example, units 141 are containers in the form of trays for electronic hardware in the form of a server, though the concepts of the present disclosure are applicable to any type of heat-producing electronic hardware, and housing 140 is a server rack.

Each unit 141 may optionally contain an onboard cooling system as shown in the illustrated example. The illustrated example of an onboard cooling system includes a driver 148, such as a fan or pump, for driving local cooling medium across a thermal load 150, an inlet thermometer 146B for measuring a temperature of an inlet stream 142B of local cooling medium, and an outlet thermometer 146A for measuring a temperature of an outlet stream 142A of local cooling medium. The onboard cooling system may also include or communicate with a thermometer or thermometers that measure the operating temperature of cooled electronic hardware stored in unit 141.

Load 150 is an object cooled by the local cooling medium flowing through or across unit 141. Load 150 may be an individual electronic hardware component or, as shown in the illustrated example, a hot electronic element 154, a heat sink 158 and a thermal interface 156 between hot electronic element 154 and heat sink 158. Hot electronic element 154 may be any piece of electronic hardware that generates heat and would benefit from cooling such as, for example, a processor die. Heat sink 158 may be any structure, such as, for example, fins, pins, or a cold plate, that facilitates transfer of heat to the loaded portion 152 of the local cooling medium that passes heat sink 158. Though only one load 150 is shown in unit 141 in the illustrated example, each unit 141 may contain multiple loads 150.

Loaded portion 152 of the local cooling medium exits unit 141 as outlet stream 142A. Outlet stream 142A joins hot side 132A of local medium loop 103 and returns to zone cooler 130. Zone cooler uses cooling element 134 to transfer heat from the heated local cooling medium returned by hot side 132A of local medium loop 103 to process water. Process water heated by cooling element 134 of zone cooler 130 travels along hot side 122A of process water loop 102 to heat exchanger 118 and chiller 120. Heat exchanger 118 and chiller 120 both transfer heat process water received from hot side 122A of process water loop 102 to plant water. Plant water heated by heat exchanger 118 and chiller 120 travels along hot side 112A of plant water loop 101 to an outer heat exchanger, such as cooling tower 114, which transfers heat from the plant water out of the building to the environment surrounding the data center. Thermal control system 100 thus uses a chain of cooling operations to collect heat from several individual loads 150 and convey that heat out of the building. That chain of operations ultimately relies on the outer heat exchanger, which is a cooling tower 114 in the illustrated example, to send heat out of the building and create capacity for heat to be carried away from the loads 150.

Because cooling tower 114, or any other outer heat exchanger that may be used to transfer plant water heat out of the building, relies on the environment outside of the building to act as a cooling medium, the difference in temperature between hot side 112A and cold side 112B of plant water loop 101 will vary with the weather. Thus, if the heat produced by the data center remains approximately constant, the temperature of cold side 112B of plant water loop 101 will decrease as the weather gets colder. In turn, if heat produced by the data center remains approximately constant as cold side 112B of plant water loop 101 gets colder, heat can be transferred from process water loop 102 to plant water loop 101 more efficiently. That is, as cold side 112B of plant water loop 101 gets colder, more heat will be transferred from the process water to the plant water at heat exchanger 118 with little to no energy cost. The process water immediately downstream of heat exchanger 118 and upstream of chiller 120 will therefore get colder as the cold side 112B of plant water loop 101 gets colder. The temperatures of process water and plant water flowing into chiller

120 will then both affect the amount of power needed to run chiller 120 to bring cold side 122B of process water loop 102 down to a given target temperature. Chiller 120 will need less power to bring the process water down to the target temperature as the difference between the temperature of the process water immediately upstream of chiller 120 and the target temperature decreases, and chiller 120 will operate more efficiently as the temperature of the plant water immediately upstream of chiller 120 gets colder. Because of the foregoing interactions, cold side 122B of process water loop 102 can be brought to lower temperatures with little or no added energy cost when the weather outside of the data center is cold. Lowering the temperature of cold side 122B of process water loop 102 can be used to make zone coolers 130 bring the cold sides 132B of their respective local medium loops 103 to their usual temperatures more efficiently or bring the cold sides 132B of their respective local medium loops 103 to lower than usual temperatures to improve the operating efficiency and longevity of cooled hardware represented by loads 150.

Figure 2A:
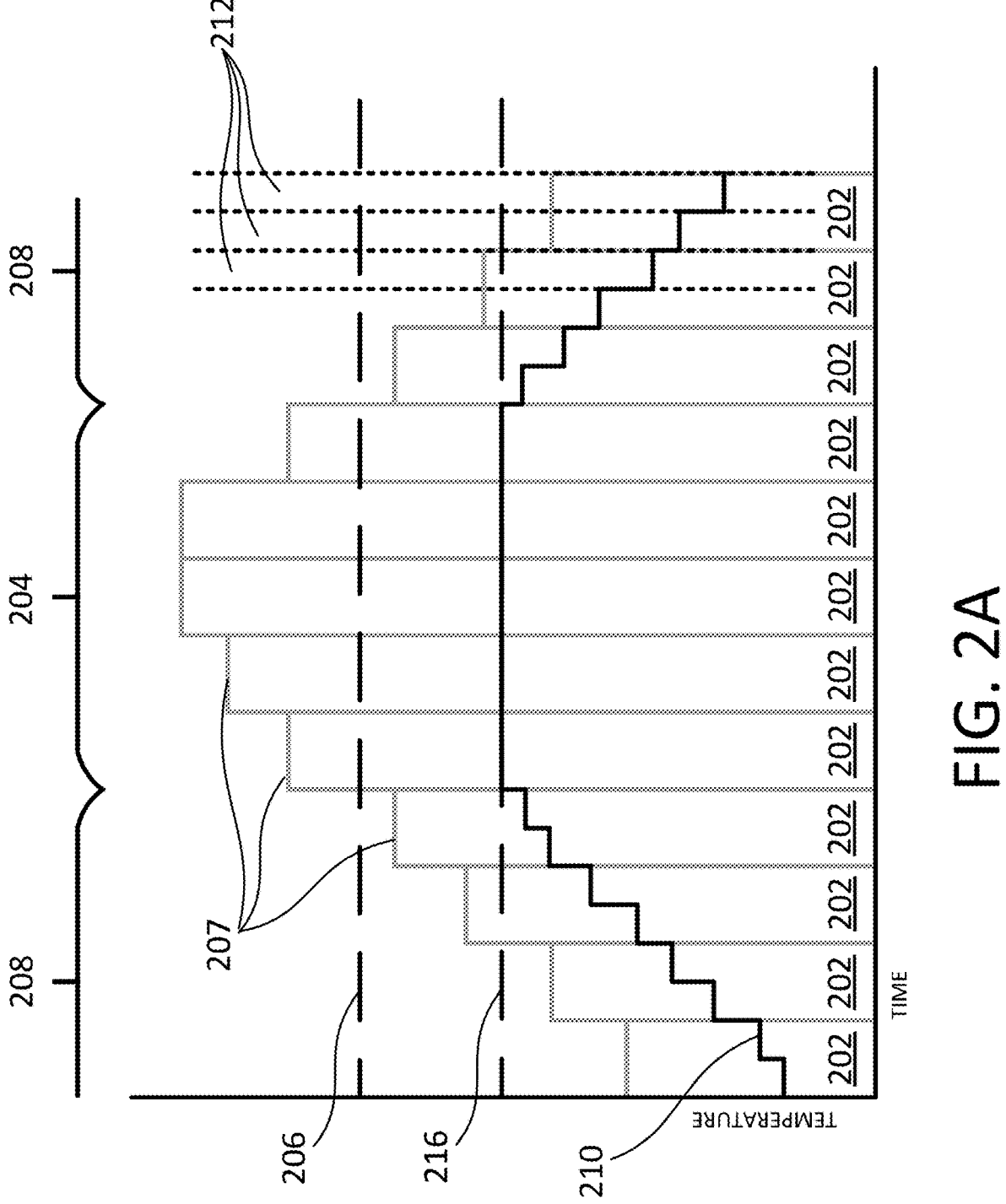
FIGS. 2A and 2B are graphs of seasonal adaptations of a target temperature for a coolant according to aspects of the present disclosure.
Figure 2B:
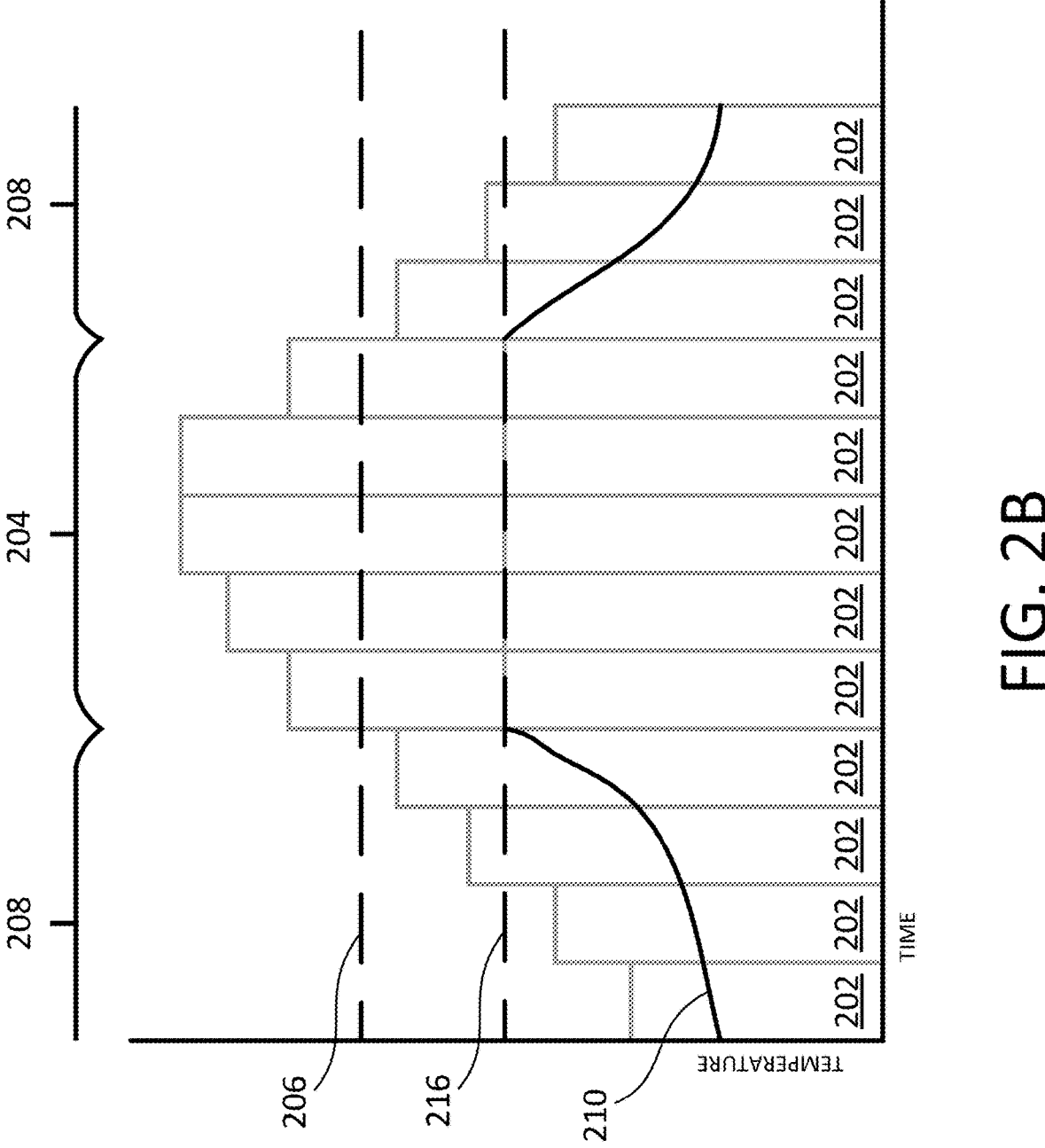

Controller 110 can be provided with instructions 117 or manually operated to take advantage of colder weather by adapting a target temperature 210 over time as shown in FIGS. 2A and 2B, where controller 110 is configured to run chiller 120 as necessary to maintain cold side 122B of process water loop 102 at or below target temperature 210. In FIGS. 2A and 2B, a year is broken into intervals 202, and those intervals 202 are grouped into either a hot season 204 or a cold season 208, with the hot season 204 and cold season 208 collectively making up an entire year. The hot season 204 includes intervals 202 during which average outside temperatures 207 exceed a threshold temperature 206, while the cold season 208 includes intervals 202 during which average outside temperatures 207 fall below threshold temperature 206. Threshold temperature 206 represents a temperature at which target temperature 210 can be lowered below ceiling temperature 216 without unacceptable energy costs.

During hot season 204, target temperature 210 is held constant at a ceiling temperature 216, which is a temperature that strikes an acceptable compromise between the cooling needs of the data center and the costs of cooling the process water during the hottest weather expected for the data center's location. Average outside temperatures 207 may be derived from historical weather data for the intervals 202 in past years. Though the hot season 208 and cold season 204 are made up of consecutive intervals 202 in the illustrated example, the seasons 204, 208 may include non-consecutive intervals depending on the region. Intervals 202 may be of any length, such as, for example, months, days, or the time between samples at the sampling rate of a live weather monitoring system. In various implementations, temperature data 207 and any other temperature measurements of conditions outside of the data center may be pure temperature measurements, i.e. dry bulb temperature ("DBT"), DBT measurements in addition to any one or any combination of humidity, wind chill, and cloud cover measurements, wet bulb temperature ("WBT"), or wet bulb globe temperature ("WBGT").

In both FIGS. 2A and 2B, target temperature 210 varies during cold season 208 in response to variations in the weather, such as by making target temperature 210 a non-piecewise function of the chosen form of temperature measurement of the weather. In the example of FIG. 2A, target temperature 210 varies on sub-intervals 212 in cold season 208 according to historical weather data for the location of the data center. Though sub-intervals 212 are half the length of intervals 202 in the illustrated example, sub-intervals 212 in other examples may be of any length, including lengths greater than the length of intervals 202. In the example of FIG. 2B, target temperature 210 varies continuously throughout cold season 208 in response to live temperature measurements or meteorological forecasts. In any case, when target temperature 210 is made to vary in response to current, predicted, or historical weather instead of being held constant at ceiling temperature 216, target temperature 210 may in various examples be set to maintain a constant difference between the outside temperature and target temperature 210 or be set as the lowest temperature of cold side 122B of process water loop 102 that is expected to be possible to maintain without exceeding acceptable energy costs.

Instead of determining a discrete hot season 204 and cold season 208 in advance as shown in FIGS. 2A and 2B, the decision of whether target temperature 210 will be either held at ceiling temperature 216 or varied with the weather can be made continuously in response to meteorological forecasts or live temperature measurements. When the determination of whether to hold target temperature 210 at ceiling temperature 216 or vary target temperature 210 with the weather is made in response to meteorological forecasts or live temperature measurements, that determination can be made continuously or on any recurring time interval. Thus, where seasons 204, 208 are not defined in advance, target temperature 210 may be allowed to climb to ceiling temperature 216 or drop below ceiling temperature day by day, or even at different times of a single day, in response to variations in the weather bringing outside temperatures above or below threshold temperature 206.

Because more heat leaves the building through cooling tower 114 in colder weather, the cold side 122B of process water loop 102 can occasionally be made colder with little or no additional energy costs by causing target temperature 210 to drop below ceiling temperature 216 when the weather is predicted or found to be cold as described in any of the above examples. Colder process water in turn makes zone cooling more efficient, so seasonal or live weather based adaptation of target temperature 210 can be used to improve the overall energy efficiency of thermal control system 100, cool electronic hardware in the data center to lower temperatures during periods of cold weather, or both. Cooling the electronic hardware to lower temperatures even occasionally will reduce the average operating temperature for that hardware over the course of a year, which will tend to improve the hardware's longevity and operating efficiency.

The weather data 207, measurements, and meteorological forecasts relied on for the adaptations described above with respect to FIGS. 2A and 2B can be of any degree of geographic specificity. For example, individually or in any combination the weather data 207, measurements, and meteorological forecasts may be derived from measurements made on site at the data center, local weather records, or regional weather reports.

Figure 3:
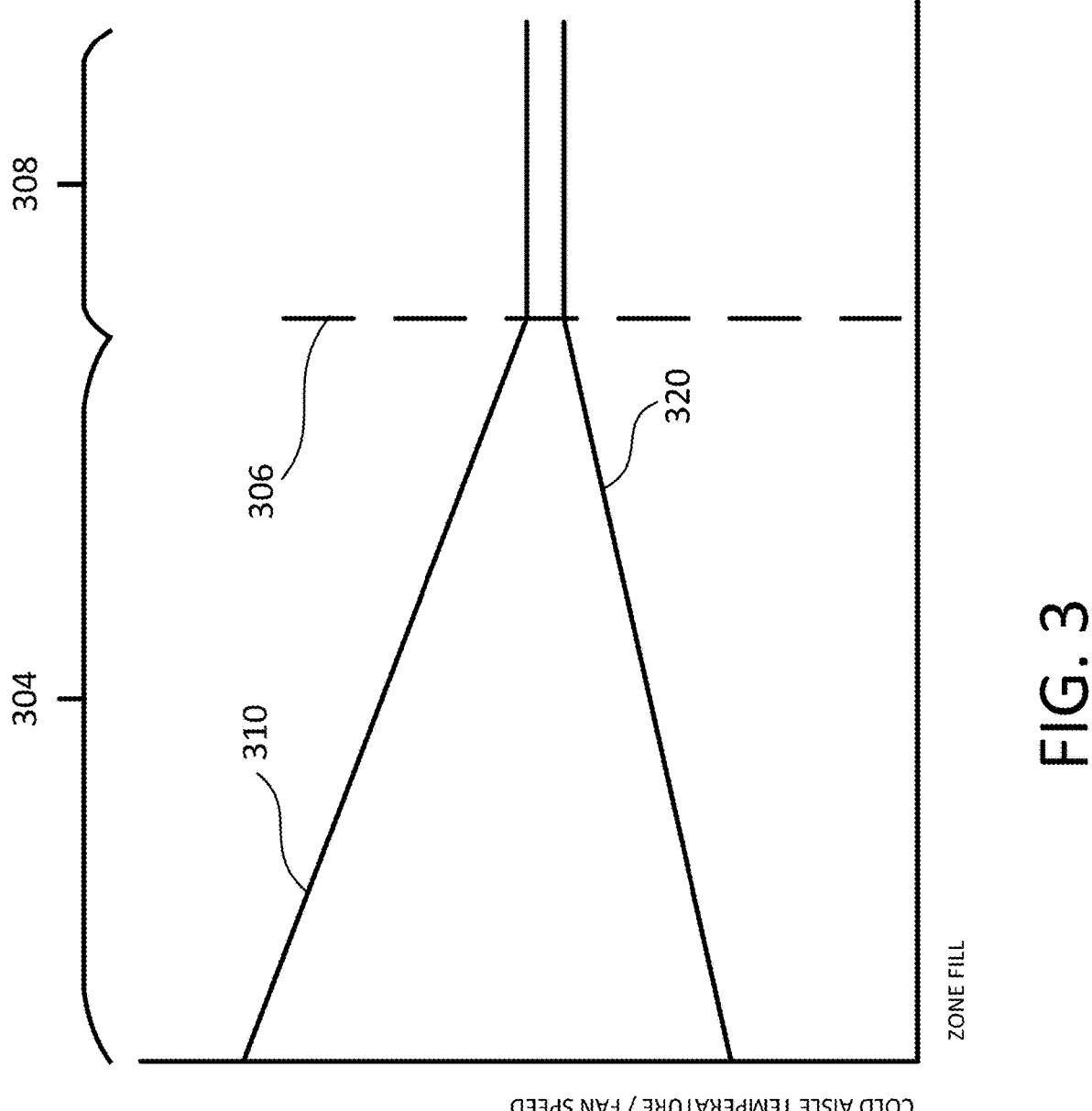
FIG. 3 is a graph of possible adaptations to coolant temperature and flow rate over dependent on a fill proportion of a zone for storing electronic hardware.

Controller 110 can instead or in addition be provided with instructions 117 or manually operated to adapt zone cooling to a fill state of a zone as shown in FIG. 3. A zone may be, for example, any space for storing a group of electronic hardware or hardware containers, such as rows of housings 140 in a server hall, in which the stored hardware cooled by a local cooling medium supplied by a single zone cooler 130 or a discrete group of zone coolers 130. For example, a server hall may be filled with rows of housings 140 each in the form of a cabinet or server rack configured to intake cooling medium in the form of cold air on one side and to exhaust hot air from the opposite side. The housings 140 in each row may face in the same directions and the rows may face in alternating directions. Thus, except for rows at the ends of the server hall, each row will have an intake side that faces the intake side of a neighboring row across an aisle of relatively cool air, and each row will have an exhaust side that faces an exhaust side of a neighboring row across an aisle of relatively hot air. The aisles of relatively cold air may be referred to as cold aisles and the aisles of relatively hot air may be referred to as hot aisles. In server halls configured this way, air in each hot aisle will be treated as at least part of a hot side 132A of a local medium loop 103, and will therefore be drawn out of the hall and directed to a zone cooler 130 in the form of one or more fans with cooling coils. The zone coolers 130 in the form of fans with cooling coils will then create the cold side 132B of the local medium loop 103 by cooling the air and blowing the cooled air into one or more cold aisles. Server halls configured this way may have multiple zone coolers 130 distributed around the hall, so zones within a hall may be identified by dividing the hall into groups of rows, or groups of portions of rows, that receive cold air primarily from a shared zone cooler 130.

Cooling in a zone that is not filled to capacity with electronic hardware can be adapted to take advantage of the lower heat load produced by that zone by decreasing the temperature of local cooling medium supplied to that zone, increasing the rate that local cooling medium is circulated through that zone, or both, any of which can be achieved with relatively little additional energy cost because of the lower heat load. For example, as shown in FIG. 3, when a zone of cold aisles as described above is filled by less than a threshold amount 306, which may be any amount less than 100% of the maximum amount of electronic hardware the zone is designed to contain, the zone cooler 130 responsible for that zone may be caused to increase fan speed 310 and decrease local coolant supply temperature 320 from their usual set points by amounts that are positively correlated with the difference between threshold amount 306 and the actual amount that the zone is filled. Supplying local cooling medium at greater flow rates and lower temperatures enables the electronic hardware to be efficiently cooled to lower temperatures. The same principles may be applied for other types of electronic hardware storage and cooling. For example, where the local cooling medium is a fluid, the speed at which the fluid is pumped through the local medium loop 103 of the zone can be increased when the zone is filled to less than the threshold amount 306. These adaptations may be applied while an initially empty zone is gradually filled with hardware, meaning the flow rate and temperature of the local cooling medium for the zone will approach their eventual set points as the zone gets closer to being filled to capacity.

FIGS. 4A-4C are each a graph of a thermal margin TM against an inlet temperature TInlet for a respective one of the piecewise functions shown in FIGS. 5A-5C. FIG. 4A shows the results of the function of FIG. 5A, FIG. 4B shows the results of the function of FIG. 5B, and FIG. 5C shows the results of the function of FIG. 5C. Each of the functions of FIGS. 5A-5C may be provided as instructions for a controller, such as instructions 117 for controller 110, for governing a thermal margin TM that a container, such as unit 141, will maintain for electronic hardware stored therein, such as element 154.

In each function of the functions of FIGS. 5A-5C, thermal margin TM is defined as a difference between a predetermined maximum tolerable operating temperature for the hardware and the actual operating temperature of the hardware. Thus, as thermal margin TM increases for a given hardware component, the actual operating temperature of that component decreases. The maximum tolerable operating temperature may be, for example, set by the hardware's manufacturer, an independent testing authority, or an owner of the particular unit of hardware in question. Inlet temperature TInlet is the temperature of an inlet stream of local cooling medium to the container, such as inlet stream 142B, which may be measured by a thermometer at the inlet to the container, such as inlet thermometer 146B.

Each piecewise function is split into a cold domain 405 below a threshold temperature 406 and a hot domain 407 above the threshold temperature 406. Threshold temperature 406 may be any temperature judged to be a point at which to change the thermal margin TM.

In the piecewise function of FIG. 5A, thermal margin TM is held constant at a floor margin in hot domain 407. Floor margin is a margin that strikes an acceptable balance between favorable operating conditions for the cooled hardware and the energy required to cool the hardware at the highest inlet temperature TInlet expected for the relevant domain, which would be hot domain 407 for the function of FIG. 5A. The function of FIG. 5A therefore applies a sub-function of a constant value, that value being the floor margin, in hot domain 407. In cold domain 405, the function of FIG. 5A applies a sub-function that creates a direct correlation between thermal margin TM and the absolute value of the difference between threshold temperature 406 and inlet temperature TInlet. In the example of FIG. 5A, the sub-function applied in cold domain 405 is a geometric function wherein the absolute value of the difference between threshold temperature 406 and inlet temperature TInlet is multiplied by a constant C, and the resulting product is added to the floor margin. However, piecewise functions according to other examples may hold thermal margin TM constant at the floor margin in hot domain 407 and apply any type of function, including non-geometric functions, to create the direct correlation between thermal margin TM and the absolute value of the difference between threshold temperature 406 and inlet temperature TInlet in cold domain 405.

Holding thermal margin TM constant at the floor margin when inlet temperature TInlet exceeds threshold temperature 406, then increasing thermal margin TM as inlet temperature TInlet falls further below threshold temperature 406 causes the cooled hardware to have a lower operating temperature at times when the local cooling medium supply gets colder, such as during the winter or when local weather gets cold, while remaining energy efficient when the local cooling medium supply is relatively warm. Stepwise functions with this behavior, such as the stepwise function of FIG. 5A, can therefore reduce a lifetime average operating temperature of adaptively cooled hardware compared to hardware held at the floor margin at all times at little energy cost.

FIGS. 5B and 5C show additional piecewise functions that create a direct correlation between thermal margin TM and the absolute value of the difference between threshold temperature 406 and inlet temperature TInlet in hot domain 407. The piecewise function of FIG. 5B holds thermal margin TM at the floor margin in cold domain 405, while the piecewise function of FIG. 5C also creates a direct correlation between thermal margin TM and the absolute value of the difference between threshold temperature 406 and inlet temperature TInlet in cold domain 407. The function of FIG. 5C could therefore also be stated as a non-piecewise function of TM=|Threshold−TInlet|*C+Floor. Increasing thermal margin in hot domain 407 can offset the deleterious effects of higher ambient temperatures, which tend to co-occur with higher inlet temperature TInlet, on the cooled electronic hardware. The piecewise functions of FIGS. 5B and 5C create their direct correlations with geometric sub-functions, but in other examples direct correlations may be created between thermal margin TM and the absolute value of the difference between threshold temperature 406 on either or both sides of threshold temperature 406 with non-geometric sub-functions.

It can be beneficial for the efficiency of cooling and circulating the local cooling medium to maintain at least a minimum difference between a hot side and a cold side of a local medium loop. Thus, in some examples, a controller responsible for a container cooling system may be provided with instructions to perform a function to seek a highest possible thermal margin TM while maintaining temperature differential DT at a target difference, or at least the target difference. According to various examples, the function to maintain temperature differential DT at a target difference, or at least the target difference, may be used instead of any of the above described piecewise functions or the function to maintain temperature differential DT at the target difference, or at least the target difference, may be used in addition to the above described piecewise functions, with the piecewise functions being overridden whenever temperature differential DT falls to the target different.

Thermal margin TM has a direct relationship to the product of temperature differential DT and the rate of local cooling medium flowing through the container. The rate of heat transfer from the cooled hardware to the local cooling medium increases as the difference in temperature between the hardware and the medium increases, so a ratio of temperature differential DT to the rate of cooling medium flowing through the container will increase as inlet temperature TInlet decreases. A ratio of thermal margin TM to the rate of local cooling medium flowing through the container will therefore also increase as inlet temperature TInlet decreases. When inlet temperature TInlet is relatively low, the flow rate of the local cooling medium through the container can therefore be driven higher without bringing the temperature differential DT below the target difference. The fan or other hardware responsible for driving local cooling medium through a container may therefore be controlled, whenever the actual inlet temperature TInlet drops below a threshold inlet temperature TInlet, to increase the flow rate of the local cooling medium in proportion to a difference between the threshold inlet temperature TInlet and an actual inlet temperature TInlet to maintain a fixed temperature differential DT while creating a greater thermal margin TM.

Figure 6:
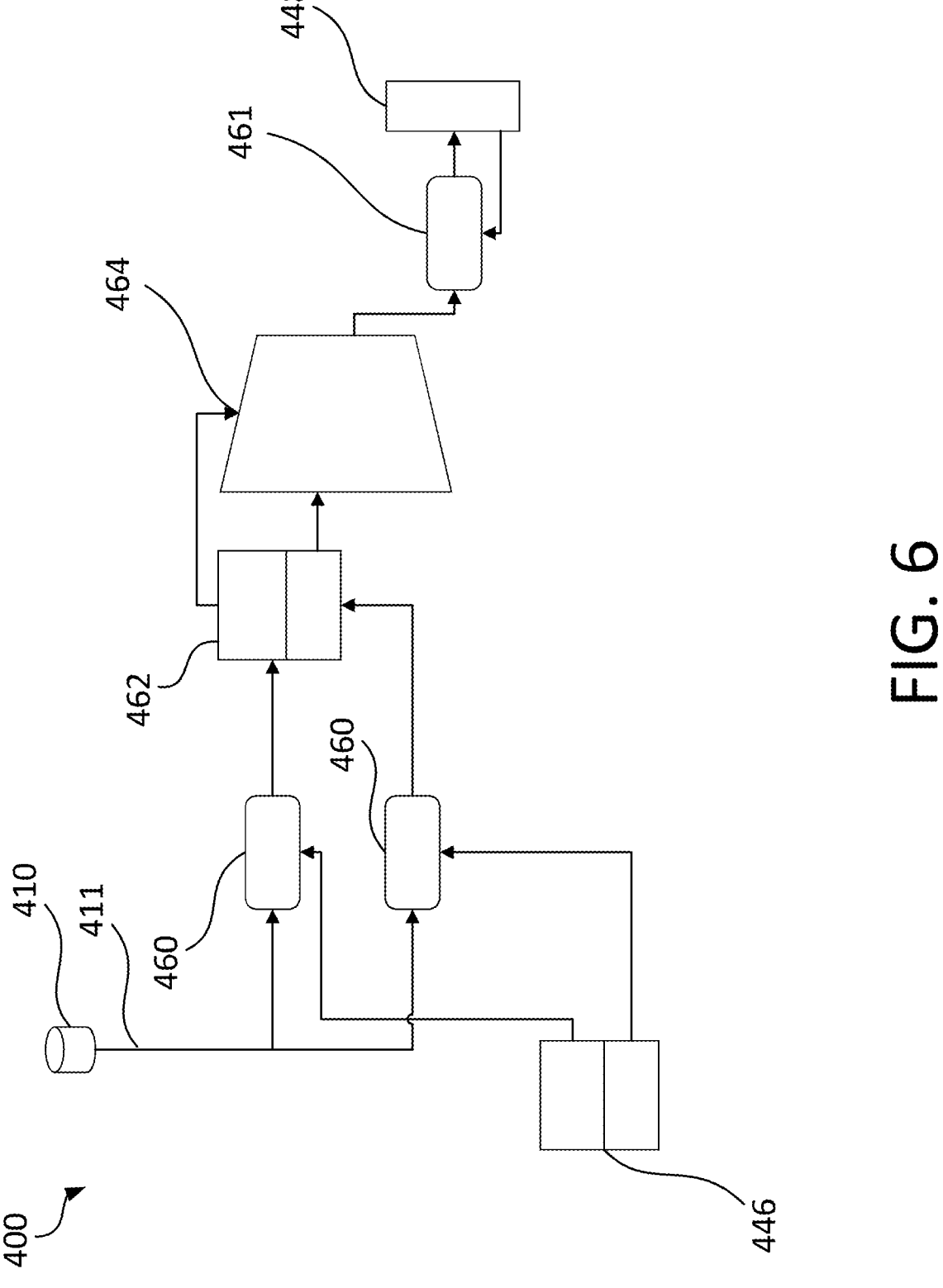
FIG. 6 is a schematic representation of a container cooling system.

FIG. 6 shows a container cooling system 400 that can be governed to create and maintain a thermal margin TM according to any of the functions described above with respect to FIGS. 4A-5D. Container cooling system 400 is configured to monitor thermal margins of multiple electronic hardware components stored in a container, such as unit 141. Cooling system 400 includes multiple margin proportional integral derivative controllers (PIDs) 460 that each receive a respective thermal margin TM to target for a respective one of the electronic hardware components stored in the container from a digital controller 410, which may be controller 110 if container cooling system 400 is integrated into a thermal control system similar to thermal control system 100, that is in electronic communication 411 with the margin PIDs 460. The margin PIDs 460 receive inputs from thermometers 446 that measure at least operating temperatures of the electronic hardware in the container and inlet temperature TInlet of local cooling medium flowing into the container. Margin PIDs 460 each receive a temperature from a thermometer that measures an operating temperature of a different respective electronic hardware component in the container. Margin PIDs 460 may optionally each receive inlet temperature TInlet from either a shared inlet thermometer, such as inlet thermometer 146, or a different respective inlet thermometer. Margin PIDs 460 may optionally also receive an outlet temperature of an outlet stream of local cooling medium from the container, such as outlet stream 142A, from one or more outlet thermometers such as outlet thermometer 146A.

Margin PIDs 460 each use the temperature measurements received from thermometers 446 to determine if the flow speed of local cooling medium through the container should increase or decrease to reach the respective thermal margin TM sought for a respective one of the electronic hardware components in the container. Outputs 462 from margin PIDs' 460 determinations are sent to a deciding controller 464. Deciding controller 464 considers outputs 462 and sends a single speed instruction to driver PID 461. Driver PID 461 governs driver 448 according to the speed instruction received from deciding controller 464. Driver 448 is any mechanism for driving local cooling medium through the container, such as, for example a fan, a pump, or any other type of mechanism that can drive a cooling medium through a space. Driver 448 may be the same as driver 448.

Deciding controller 464 according to various examples may be configured to choose either the lowest output 462 received or a highest output 462 received to be sent as a single speed instruction to driver PID 461. In other examples, deciding controller 464 may be configured to arrive at a compromise among the outputs 462 received, such as, for example, an arithmetic mean of fan speeds that would satisfy each of the outputs 462 received, and to send that compromise speed as an instruction to driver PID 461. Deciding controller 462 can be any device capable of performing whichever of the foregoing logical functions for which deciding controller 462 is configured in a given implementation, such as, for example, an integrated circuit or a programmable logic controller (PLC).

Though two margin PIDs 460 are shown in the illustrated example, container cooling system 400 may be provided with any number of margin PIDs 460 receiving measurements from thermometers 446 and instructions from digital controller 410 and sending outputs 462 to deciding controller 464. The number of margin PIDs 460 in a given implementation of container cooling system 400 may equal a number of electronic hardware components in the container that are intended to be independently monitored when deciding the speed for driver 448. Thus, container cooling system 400 may include any plural number of margin PIDs 460. In other examples, container cooling system 400 may include only a single margin PID 460. In such examples, the single margin PID 460 may send output 462 directly to driver PID 461 without passing the output 462 through a deciding controller 464, or the margin PID 460 and driver PID 461 may be integrated as a single PID.

Figure 7A:
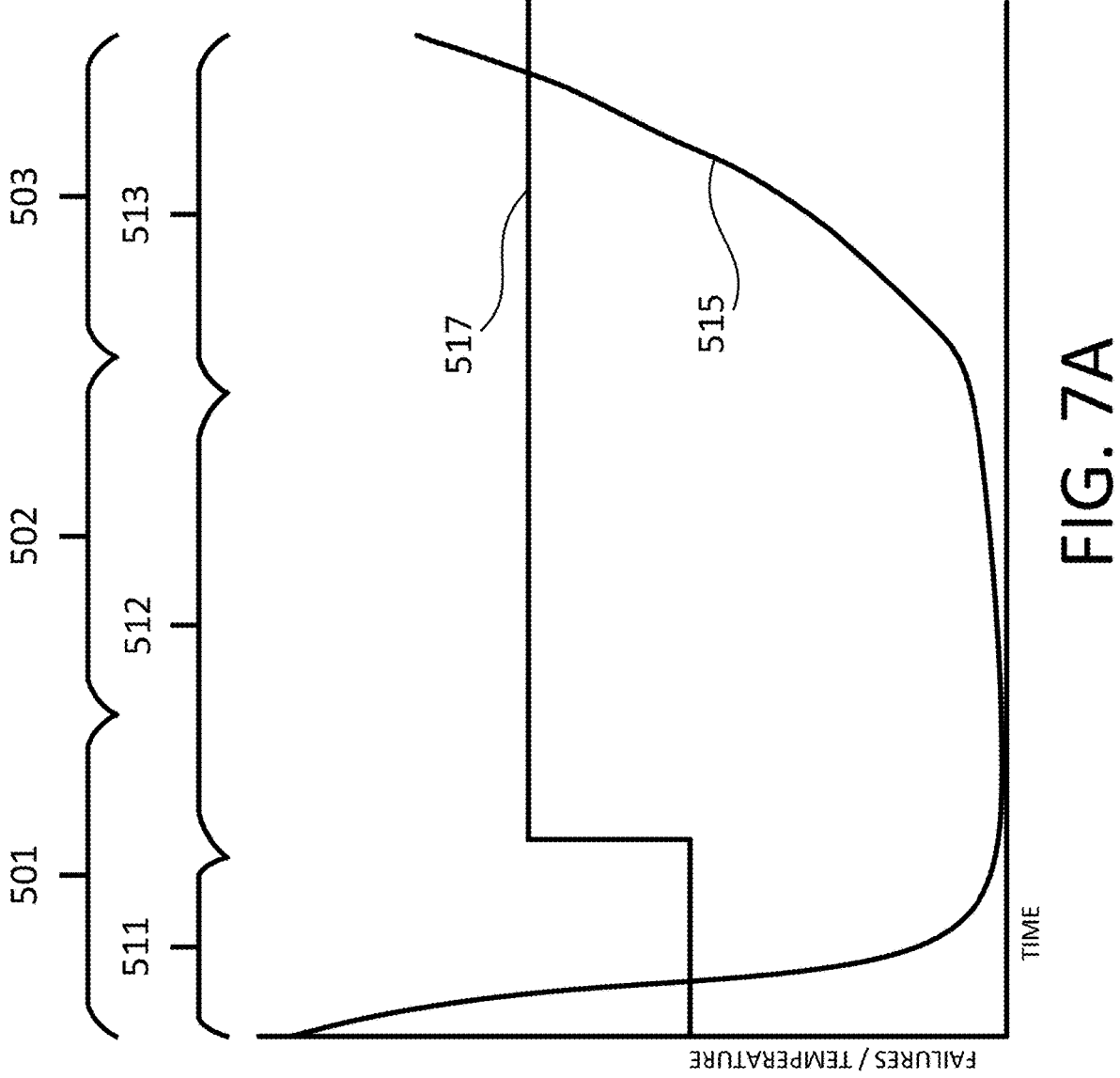
FIGS. 7A-7C are graphs of thermal margin adaptations dependent on age of a fleet of electronic hardware.
Figure 7B:
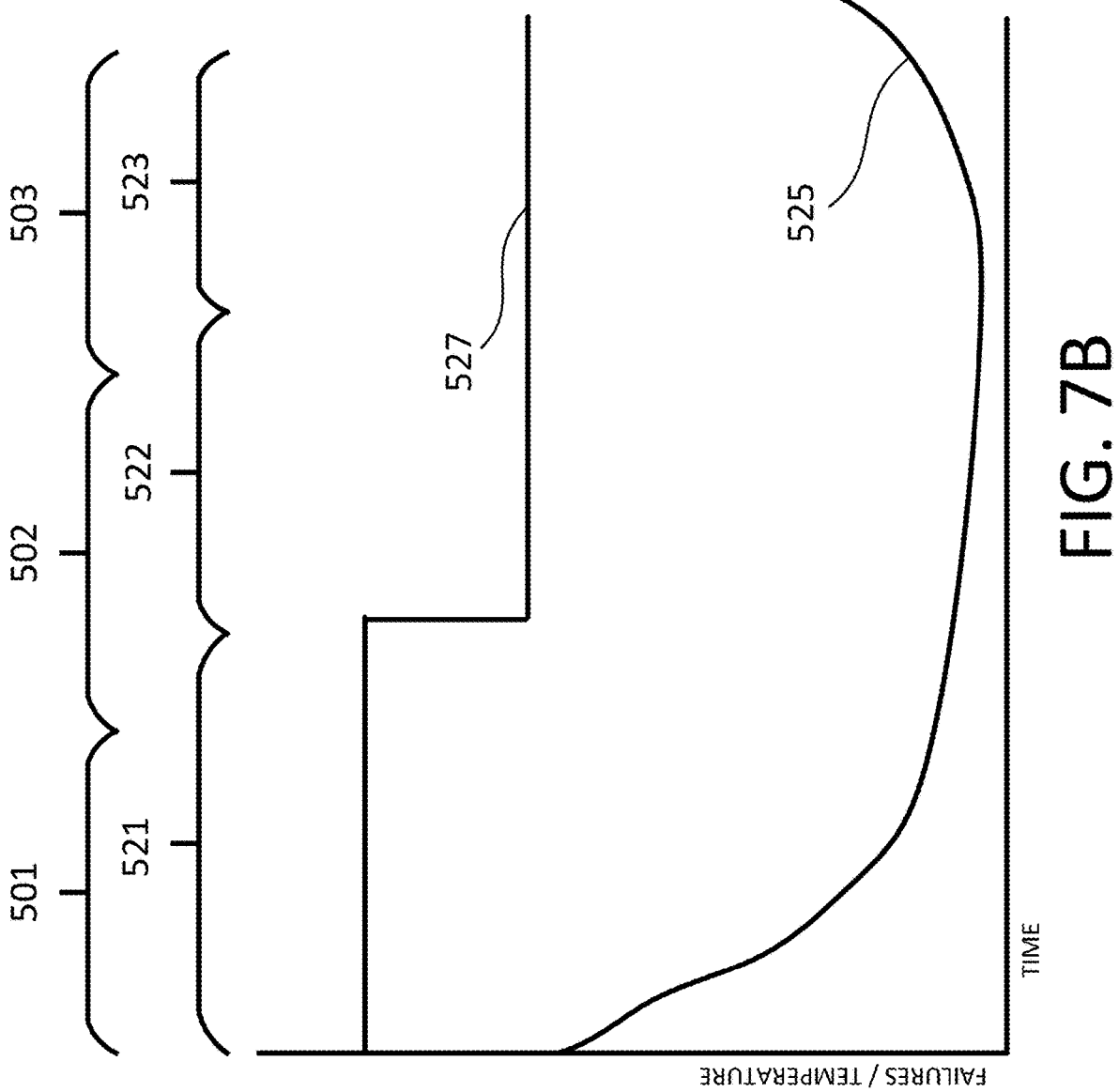
Figure 7C:
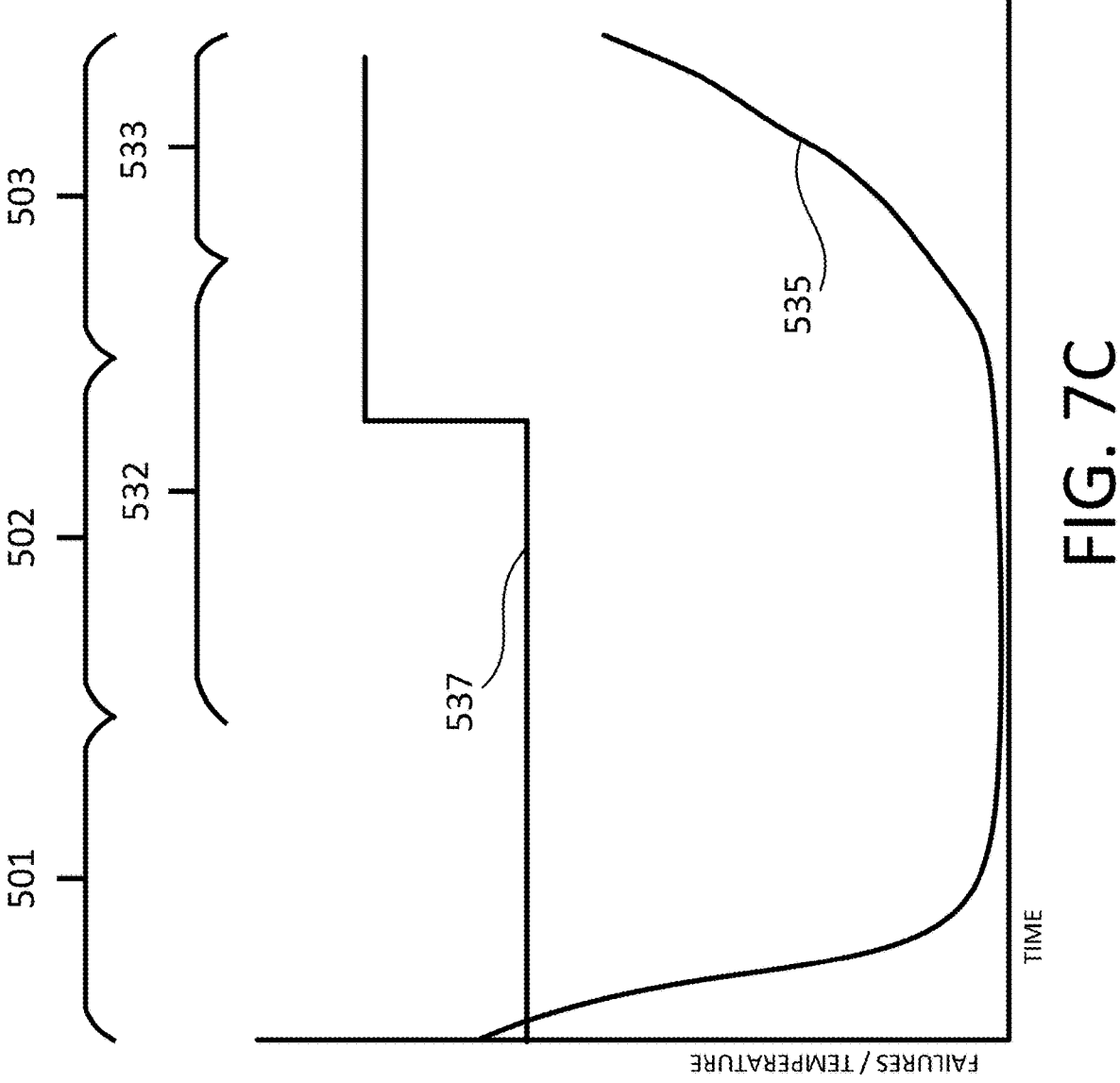

FIGS. 7A-7C illustrate adaptive thermal margin profiles 517, 527, 537, 547 for installations of multiple electronic hardware components. In each of FIGS. 7A-7D, the profiles 517, 527, 537, 547 are illustrated in view of a typical early failure stage 501, stable stage 502, and wear out stage 503 that may be derived from historical data for hardware of the same type as the adaptively cooled hardware or predicted for hardware where no such historical data is available. Early failure stage 501, stable stage 502, and wear out stage 503 are parts of a "bath tub curve" frequently observed in the failure rate of mass manufactured items. Early failure stage 501 is a stage following installation of the hardware during which failures due to manufacturing defects are expected. Stable stage 502 follows early failure stage 501. During stable stage 502, few failures are expected because most defective parts have already failed, but inevitable, use related wear out failures have not begun. Wear out stage 503 follows stable stage 502. Failure rates climb throughout wear out stage 503 until all parts have failed due to use related deterioration. Failure rates for a fleet of hardware will typically decrease during early failure stage 501, remain relatively steady during stable stage 502, then increase throughout early failure stage 503. Thus, a transition from early failure stage 501 to stable stage 502 may be defined at an earliest time following installation that failure rate of the hardware decreases at less than a predetermined rate. Similarly, a transition from stable stage 502 to wear out stage 503 may be defined at an earliest time following installation that failure rate of the hardware increases by more than a predetermined rate. Any values may be used for the predetermined decrease rate and predetermined increase rate for marking these transitions. Specific examples of predetermined increase rates or predetermined decrease rates that may mark the transitions between stages include 1% per day, 2% per day, 3% per day, 4% per day, 5% per day, 10% per day, 15% per day, 20% per day, and 25% per day.

FIGS. 7A-7C each present a respective example of how a thermal margin floor for a fleet of components in a single installation can be adapted over time to alter a failure rate curve for that fleet. In FIG. 7A, thermal margin floor 517 for a fleet of components is made lower during a portion of early failure stage 501 than at any point during stable stage 502. This accelerated early failure rate is visible in the relative height of a left-most portion of adapted failure rate curve 515. Reducing thermal margin floor 517 for the fleet of hardware causes the expected early failures to arrive earlier, resulting in an adapted early failure stage 511 that is shorter than the early failure stage 501 that would be observed if thermal margin floor 517 was kept constant over the life of the hardware in the fleet. Thus, an adapted stable stage 512 that follows adapted early failure stage 501 arrives earlier than the typical stable stage 502 and an adapted wear out stage 513 that follows adapted stable stage 512 arrives earlier than the typical wear out stage 503. Reducing thermal margin floor 517 early in the life of a fleet of hardware can therefore be useful in applications where reliable operation throughout the fleet is needed, since defective parts can be identified and replaced early in the life of the fleet.

The amount of time that thermal margin floor 517 may be kept low following installation of the fleet can, in various examples, be a predetermined amount of time or an amount of time corresponding to either the transition from typical early failure stage 501 to typical stable stage 502 or actual or predicted transition from adapted early failure stage 511 to adapted early failure stage 512. As noted above, these transitions may be marked by the earliest time following installation of the fleet that the typical, actual, or predicted failure rate failure rate decreases by less than a predetermined amount.

As shown in FIG. 7B, a thermal margin floor 527 can be elevated during an adapted early failure stage 521 to slow the failure rate 525 during the adapted early failure stage 521, thereby causing adapted early failure stage 521 to last longer than typical early failure stage 501. As a result, adapted stable stage 522 arrives later than typical stable stage 502 and adapted wear out stage 523 arrives later than typical wear out stage 523. Raising thermal margin floor 527 early in the life of the fleet can therefore be useful to reduce peak demand for replacement hardware from what would be expected during typical early failure stage 501.

The amount of time that thermal margin floor 527 may be kept high following installation of the fleet can, in various examples, be a predetermined amount of time or an amount of time corresponding to either the transition from typical early failure stage 501 to typical stable stage 502 or actual or predicted transition from adapted early failure stage 521 to adapted early failure stage 522. As noted above, these transitions may be marked by the earliest time following installation of the fleet that the typical, actual, or predicted failure rate failure rate decreases by less than a predetermined amount.

As shown in FIG. 7C, an adapted stable stage 532 can be extended beyond typical stable stage 502 by increasing a thermal margin floor 537 before typical wear out stage 503 is expected to arrive. By maintaining the elevated thermal margin floor 537 during adapted wear out stage 513, a failure rate 535 during adapted wear out stage 533 can be made relatively low. Elevating thermal margin floor 537 before typical wear out stage 503 is expected to arrive can therefore delay the need for replacement hardware and slow the rate at which hardware must be replaced after it begins to wear out. The adaptation of FIG. 7C can be applied together with the adaptation of either FIG. 7A or FIG. 7B. According to various examples, after applying either a relatively high or a relatively low thermal margin floor during at least part of typical early failure stage 501, the thermal margin floor may be elevated before the expected arrival of typical wear out stage 503, early adapted wear out stage 513, or late adapted wear out stage 523.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. A data center thermal control system for cooling a fleet of electronic components, the control system comprising one or more processors and a non-transitory computer-readable medium storing instructions that, when executed by the one or more processors, would cause the processors to govern the control system to cool the fleet to a different thermal margin floor during at least a portion an early failure stage than during a stable stage, wherein:

the early failure stage being a window after installation of the components during which an expected failure rate for the components, according to historical failure data, decreases at least at a first rate;

the stable stage being a window after the early failure stage during which the failure rate for the components, according to historical failure data, decreases at less than the first rate and increases at less than a second rate; and the thermal margin is a difference between a predetermined temperature and an actual operating temperature of the component, wherein the different thermal margin floor during at least a portion of the wear out stage is elevated than at any point during the stable stage.

2. The control system of claim 1, wherein the instructions, when executed by the one or more processors, would cause the processors to govern the control system to cool the fleet to a stable thermal margin floor during the stable stage and an early margin floor during the early failure stage, wherein the early margin floor is less than the stable margin floor.

3. The control system of claim 2, wherein the instructions, when executed by the one or more processors, would cause the processors to govern the control system to cool the fleet to the early margin floor from installation of the fleet until an adapted stable transition time and to begin cooling the fleet to at least the stable margin floor at the adapted stable transition time, wherein the adapted stable transition time is an earliest time following installation of the fleet when an actual failure rate of components among the fleet is expected to decrease by less than a predetermined rate.

4. The control system of claim 1, wherein the historical failure data is derived from observed failures of electronic equipment of a same type as the components before the installation.

5. The control system of claim 1, wherein the different thermal margin during at least a portion of the early failure stage is lower than at any point during the stable stage.

6. The control system of claim 5, wherein an amount of time the different thermal margin floor is kept lower is a predetermined amount of time or an amount of time corresponding to either a transition from a typical early failure stage to a typical stable stage or an actual or predicted transition from an adapted early failure stage to an adapted early stable stage.

7. The control system of claim 1, wherein the different thermal margin during at least a portion of the early failure stage is elevated than at any point during the stable stage.

8. The control system of claim 7, wherein an amount of time the different thermal margin floor is kept elevated is a predetermined amount of time or an amount of time corresponding to either a transition from a typical early failure stage to a typical stable stage or an actual or predicted transition from an adapted early failure stage to an adapted early stable stage.

9. A data center thermal control system for cooling a fleet of electronic components, the control system comprising one or more processors and a non-transitory computer-readable medium storing instructions that, when executed by the one or more processors, would cause the processors to govern the control system to cool the fleet to a different thermal margin floor during at least a portion an early failure stage than during a stable stage, wherein:

the early failure stage being a window after installation of the components during which an expected failure rate for the components, according to historical failure data, decreases at least at a first rate;

the stable stage being a window after the early failure stage during which the failure rate for the components, according to historical failure data, decreases at less than the first rate and increases at less than a second rate; and the thermal margin is a difference between a predetermined temperature and an actual operating temperature of the component, wherein the instructions, when executed by the one or more processors, would cause the processors to govern the control system to cool the fleet to a stable thermal margin floor during the stable stage and an early margin floor during the early failure stage, wherein the early margin floor is less than the stable margin floor, wherein the instructions, when executed by the one or more processors, would cause the processors to govern the control system to cool the fleet to the early margin floor from installation of the fleet until an adapted stable transition time and to begin cooling the fleet to at least the stable margin floor at the adapted stable transition time, wherein the adapted stable transition time is an earliest time following installation of the fleet when an actual failure rate of components among the fleet is expected to decrease by less than a predetermined rate, and wherein the predetermined rate is a predetermined increase rate or a predetermined decrease rate marking transitions between the early failure stage, the stable stage, and the wear out stage.

10. The control system of claim 9, wherein the predetermined rate comprises 1% per day, 2% per day, 3% per day, 4% per day, 5% per day, 10% per day, 15% per day, 20% per day, and 25% per day.

\* \* \* \* \*